United States Patent [19]

Attwood

[11] 4,182,992
[45] Jan. 8, 1980

[54] PULSE WIDTH MODULATED SIGNAL AMPLIFIER

[76] Inventor: Brian E. Attwood, Sestri 49, Smithbarn Horsham, Sussex RH13 6DS, England

[21] Appl. No.: 896,243

[22] Filed: Apr. 14, 1978

[30] Foreign Application Priority Data

| Apr. 15, 1977 | [JP] | Japan | 52-43399 |
| Apr. 22, 1977 | [JP] | Japan | 52-45998 |
| Apr. 22, 1977 | [JP] | Japan | 52-50398[U] |

[51] Int. Cl.² ............................................... H03F 3/38
[52] U.S. Cl. ...................................... 330/251; 330/10; 330/207 A; 330/302
[58] Field of Search ................. 330/10, 207 A, 251, 330/302

[56] References Cited

U.S. PATENT DOCUMENTS 3,384,830  5/1968  Deniet ................................. 330/251

Primary Examiner—Lawrence J. Dahl
Attorney, Agent, or Firm—Harris, Kern, Wallen & Tinsley

[57] ABSTRACT

A pulse width modulated signal amplifier includes first and second switching transistors and a diode which are connected in series across a DC power source and in the forward direction with respect to the polarity of the DC power source, the diode being connected between the first and second transistors. The first transistor has its base connected to a corresponding terminal of the DC power source and the second transistor has its base supplied with a pulse width modulated signal to be amplified. A connection point of the first transistor and a diode is connected to a lowpass filter which provides a demodulated audio signal to a load. A coil is connected between the diode and the second transistor and the connection point of the coil and the second transistor is connected to the base of first transistor.

7 Claims, 10 Drawing Figures

(A) INPUT Vi (B) OUTPUT CURRENT Io (C) OUTPUT VOLTAGE Vo t1~t2 t2~t3

PULSE WIDTH MODULATED SIGNAL AMPLIFIER

This invention relates to a pulse width modulated signal amplifier circuit.

As a high efficiency amplifier is known a pulse width modulated signal amplifier or Class D amplifier which demodulates a pulse width modulated signal produced by pulse width modulating with an audio signal a clock pulse signal or carrier signal having a frequency much higher than the audio signal to drive a loudspeaker.

A basic Class D amplifier includes a pair of switching transistors connected in series across a DC power source and arranged to be alternately switched ON and OFF in response to a pulse width modulated input signal applied thereto, a lowpass filter having a choke coil connected to the junction of the paired transistors to provide a demodulated audio signal to a load such as a loudspeaker, and reverse current by-passing or recovery diodes connected in series across the DC power source, the junction of diodes being connected to the junction of switching transistors. With this Class D amplifier, a change-over amplitude distortion is produced in the waveform of the output pulse voltage at an output point, i.e., the junction between the switching transistors and thus a current cross-over distortion occurs in the audio signal applied to the load at the transition periods between positive and negative half cycles of the modulating audio signal.

Also is known a Class D amplifier arranged such that first and second switching transistors and a diode are connected in series across a DC power source and in the forward direction with respect to the polarity of the DC power source, the diode being connected between first and second switching transistors, the base of first transistor is connected to the DC power source and to the junction of the diode and the second transistor, and a pulse width modulated signal is applied to the base of second transistor. In this circuit configuration the second transistor is switched ON and OFF directly by the pulse width modulated input signal, and, on the other hand, the first transistor is switched in response to the ON-OFF state of the second transistor. With this circuit arrangement, therefore, it is required that the switching action of the first transistor be performed rapidly.

It is the object of this invention to provide a pulse width modulated signal amplifier capable of both improving and maintaining substantially constant the switching speed of a switching transistor which is switched by the state of another switching transistor directly switched by a pulse width modulated signal to be amplified.

According to this invention there is provided a pulse width modulated signal amplifier comprising: a DC power source having first and second terminals; first and second transistor means each having a control electrode and a conduction path and a diode which are connected in series between the first and second terminals of the DC power source and in the forward direction with respect to the polarity of the DC power source such that the first and second transistor means are positioned at the sides of the first and second terminals of said DC power source, respectively, and the diode is connected between the first and second transistor means; a lowpass filter having a choke coil and connected between a load and a junction of the first transistor means and said diode; an inductance connected between the diode and the second transistor means; first connection means for connecting a junction of the inductance and the second transistor means to the control electrode of the first transistor means; second connection means for connecting the control electrode of the first transistor means to the first terminal of the DC power source; and means for applying a pulse width modulated signal to be amplified to the control electrode of the second transistor means.

This invention can be more fully understood from the following detailed description when taken in conjunction with the accompanying drawings, in which.

Figure 1:
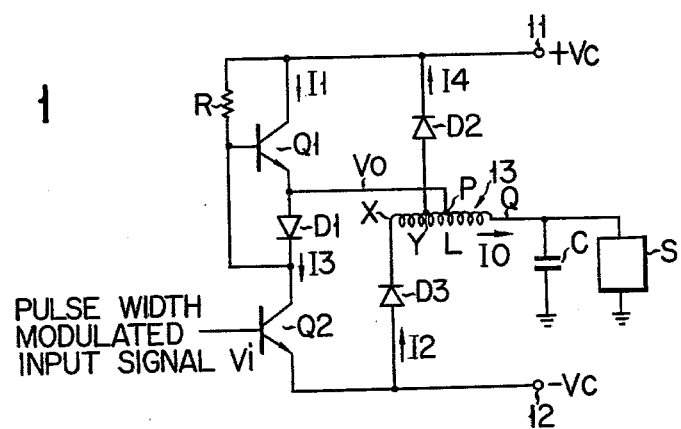
FIG. 1 is an example of basic pulse width modulated signal amplifier for explaining the present invention.

In FIG. 1 showing schematically an example of a Class D amplifier using a so-called totem-pole circuit, between positive and negative power supply terminals 11 and 12 of a DC power source (not shown) are connected NPN type transistors Q1 and Q2 and a diode D1 in series and in the forward direction with respect to the polarity of the DC power source, the diode D1 being connected between the transistors Q1 and Q2. The junction of the collector of transistor Q2 and the cathode of diode D1 is connected to the base of transistor Q1 which is in turn connected to the positive power supply terminal 11 through a resistor R. The junction of the emitter of transistor Q1 and the anode of diode D1 is connected to an intermediate tap of a choke coil L one end Q of which is connected to ground through a load S such as a loudspeaker. The end Q of choke coil L is also connected to ground through a capacitor C which constitutes a lowpass filter 13 in combination with the choke coil L.

Between another end X of choke coil L and the negative power supply terminal 12 a reverse current by-passing or recovery diode D3 is connected with the polarity as shown. Between the positive power supply terminal 11 and an intermediate tap of the choke coil L positioned between the points X and P thereof a recovery diode D2 is connected with the polarity as shown. The base of transistor Q2 is connected to receive a pulse width modulated input signal Vi to be amplified.

Figure 2:
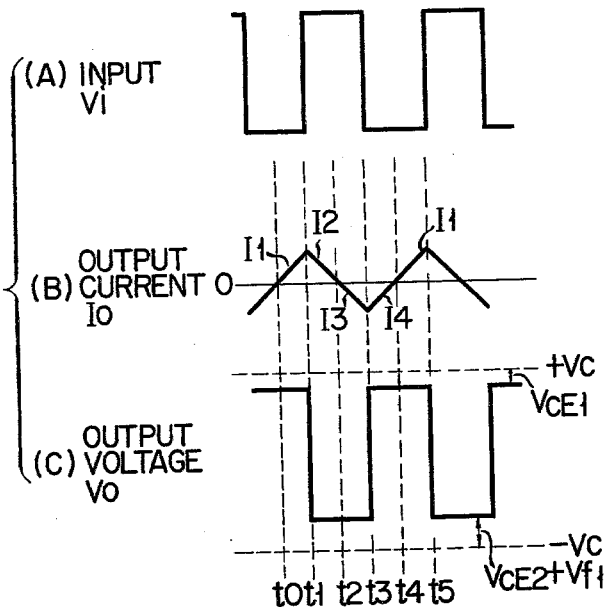
FIGS. 2, 3A, 3B, 3C and 3D are diagrams for explaining the operation of the circuit of FIG. 1.
Figure 3A:
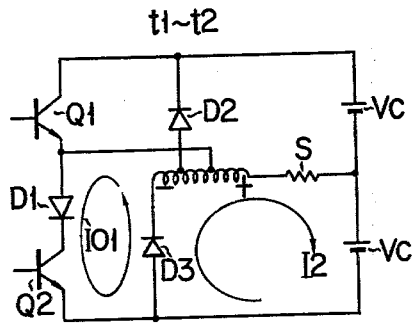
Figure 3B:
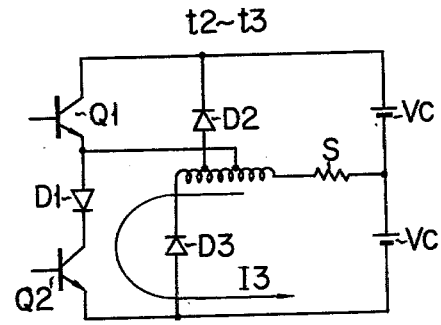
Figure 3C:
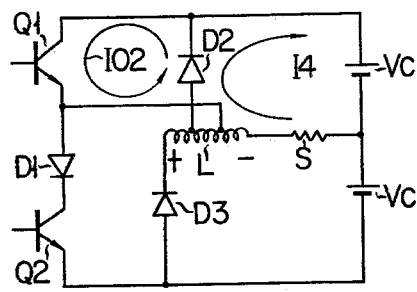
Figure 3D:
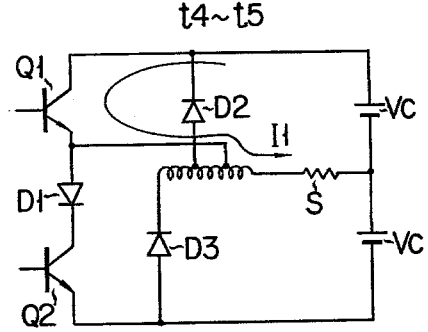

The operation of the Class D amplifier shown in FIG. 1 will be described with reference to FIGS. 2 and 3. When a rectangular waveform signal or carrier signal which is not modulated with an audio signal and has a duty factor of $\frac{1}{2}$ as shown in FIG. 2A is applied to the base of transistor Q2 a current I0 flows between the points P and Q of the choke coil L which has a triangle waveform as shown in FIG. 2B. It is assumed herein that a current flowing from the point P to the point Q is positive. When the transistor Q1 is rendered nonconducting and the transistor Q2 is rendered conducting during the period that a positive current I1 flows through the transistor Q1 the flow of current I1 is ceased with a result that a counter electromotive force is generated across the choke coil L during the period t1 to t2 which allows a positive current I2 to flow through the diode D3 as shown in FIG. 3A. At this time, if an induced voltage appearing across the points X and P of the choke coil L is substantially equal to the sum of the collector-emitter saturation voltage of transistor Q2 and the forward voltage drops across the diodes D1 and D3, only a low circulation current I01 can flow in a closed loop formed by a portion of choke coil L, diode D1, transistor Q2 and diode D3. After the current I2 has become zero a negative current I3 flows through the diode D1 and transistor Q2 during the period t2 to t3 as shown in FIG. 3B. Next, when the transistor Q2 is rendered nonconducting and the transistor Q1 is rendered conducting the flowing of current I3 ceases so that a counter electromotive force is generated in the choke coil L during the period t3 to t4 which allows a negative current I4 to flow through the diode D2 as shown in FIG. 3C. If, at this time, a voltage having a magnitude substantially equal to the sum of the collector-emitter saturation voltage of transistor Q1 and the forward voltage drop of diode D2 is generated across the points Y and P of choke coil L, then only a low circulation current I02 can flow through a closed loop formed by a portion of choke coil L, transistor Q1 and diode D2. After the negative current I4 has become zero the positive current I1 flows through the transistor Q1 during the period t4 to t5 as shown in FIG. 3D.

The output voltage V0 at the junction of transistor Q1 and diode D1 takes, as shown in FIG. 2C, a value which is lower than the positive supply voltage +Vc by the collector-emitter saturation voltage $V_{CE1}$ of transistor Q1 and a value which is higher than the negative supply voltage −Vc by the sum of the forward voltage drop Vf1 across the diode D1 and the collector-emitter saturation voltage $V_{CE2}$ of transistor Q2. With the abovementioned circuit, since the output voltage V0 does not fluctuate in each half cycle thereof, occurrence of the cross-over distortion of audio signal at transition times between negative and positive half cycles of the audio signal can be substantially eliminated but no mechanism exists for increasing the switching speed and maintaining it constant over the dynamic operating range.

In the circuit of FIG. 1, when the transistor Q2 is rendered conducting during the period that the transistor Q1 is ON a current flows through the transistor Q1, diode D1 and the transistor Q2 with the result that the resultant forward voltage drop of diode D1 back-biases the base-emitter junction of transistor Q1 to render it nonconducting. When the transistor Q1 is OFF a relatively large current I3 flows through the diode D1 so that the transistor Q1 is more steadily rendered nonconducting. On the other hand, when the transistor Q2 is rendered nonconducting no current flows through the diode D1 with the result that the transistor Q1 becomes forward-biased by the positive supply voltage +Vc through the resistor R to conduction. With the totempole circuit as described above, the ON-OFF state of switching transistor Q1 depends on the ON-OFF state of other switching transistor Q2 supplied with an input signal. Accordingly, it is necessary to make the switching speed of transistor Q1 higher. More particularly, it is necessary to improve the switching speed of transistor Q1 with which the transistor Q1 is switched from the OFF state to the ON state and further maintains said switching speed substantially constant over the dynamic operating range of the system. Where this switching speed is low or varies, then no sharp rise or constancy of current which flows through the transistor Q1 cannot be expected, causing a distortion to occur in the output waveform.

Figure 4:
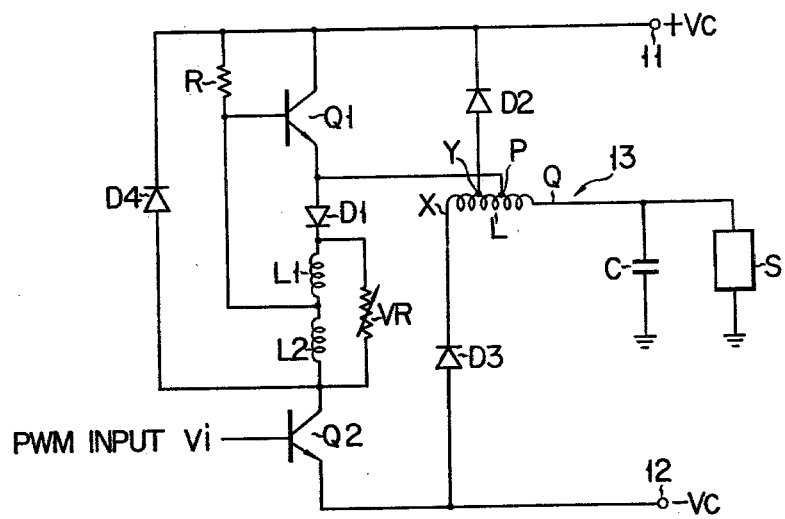
FIG. 4 is a circuit diagram showing an example of the pulse width modulated signal amplifier according to the present invention.

An example of a pulse width modulated signal amplifier in accordance with this invention will be described hereinbelow with reference to FIG. 4. The same parts of FIG. 4 as those of FIG. 1 are designated by the like reference characters. Between the cathode of diode D1 and the collector of transistor Q2 is connected an inductive network including series-connected coils L1 and L2 the connection point or intermediate tap of which is connected to the base of transistor Q1. The junction of the coil L2 and the collector of transistor Q2 is connected to the anode of a reverse current by-passing diode D4 the cathode of which is connected to the positive power supply terminal 11.

Figure 5:
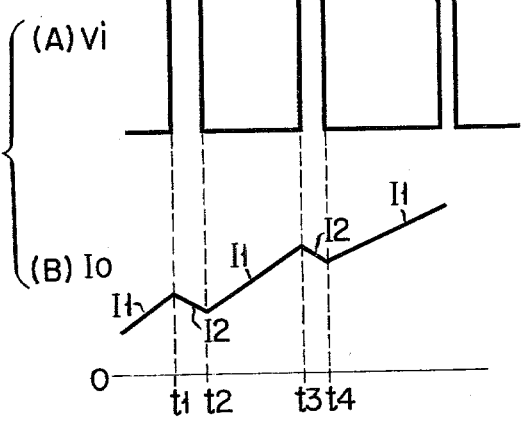
FIG. 5 is a waveform diagram for explaining the operation of the circuit of FIG. 4.

It is assumed here that an input signal Vi modulated with an audio signal as shown in FIG. 5A is applied to the base of transistor Q2. The output current I0 flowing through the choke coil L during the periods t1 to t2 and t3 to t4 that the transistor Q1 is OFF and the transistor Q2 is ON is the current I2 which flows through the diode D3, and the output current I0 during the period t2 to t3 that the transistor Q1 is ON and the transistor Q2 is OFF corresponds to the current I1 which flows through the transistor Q1 and varies in accordance with the envelope of the audio signal.

As shown in FIG. 3A, the circulation current I01 flows through the diode D1 and transistor Q2 during the period that the positive current I2 flows through the diode D3 in the half cycle of audio signal during which a positive current always flows through the choke coil L. The number of turns in the coil L between the points P and Q in FIG. 4 is fixed and determined by considerations such as the output bandwidth but the number of turns between the points X and P is altered so as to provide an offset voltage which is not just substantially equal to cancel voltage drops in the circuit but is greater and preferably considerably greater than would be present in the FIG. 3A configuration. Thus, a heavy circulation current I01 will flow. The number of turns between X and P is chosen in conjunction with the forward voltage drops in D1, L1, L2, etc. so that there is sufficient current flow to work on the minimum rise/fall time curve of any given transistor thereby allowing high speed switching of the transistors. As a result of this heavy circulation current I01 which is of the order of amps, upon nonconduction of transistor Q2 a counter electromotive force is generated across the coil L1 which allows forward-biasing of the transistor Q1, resulting in quick conduction of the transistor Q1. From the above, it will be seen that the values chosen for the inductances of coils L1 and L2 affect the heavy circulating current I01. It is preferred to make the coils L1 and L2 adjustable so that the current values can be set up during assembly of the amplifier. In addition to affecting the heavy circulating current I01, the value of the coil L1 is optimised to provide improved base drive to the transistor Q1. The addition of a coil L2 also sets up a heavy circulating current I03 around D4, Q1, D1, L1 which is in addition to I02 and thus provides (a) optimisation of the working point of Q1 for minimum t rise and t fall as in the use of Q2; (b) provides desaturation of the output device Q1 for even higher speed operation; and (c) there exists between the collector and emitter of transistor Q2 a large capacitance of several hundreds of pF including capacitance provided by a heat sink. Accordingly, if only the coil L1 is provided, the aforesaid large value capacitance is connected to the base of transistor Q1, disabling the quick switching action of transistor Q1. The provision of coil L2 for all the reasons given above, gives the additional desirable feature that the coil L2 tends to electrically isolate the collector-to-emitter capacitance of transistor Q2 from the base of transistor Q1. As mentioned, the counter electromotive force generated across the coil L2 is discharged through the diode D4, transistor Q1, diode D1 and coil L1 to set up current I03. It is thus common for the coils L1, L2 to have different values of inductance although this need not happen in every case. Another advantage resulting from the inductive network connected between the diode D1 and transistor Q2 is to limit a current which may flow through the transistor Q1, diode D1 and transistor Q2 from the positive power supply terminal 11 to the negative power supply terminal 12 at switching transition times.

Resistors R1 and R2 are provided to alter the Q of the coils L1 and L2 respectively to allow more individual adjustment to the base drive of transistor Q1. In some circumstances they can be dispensed with when resistive wire is used for the coils. Having adjusted the circuit for optimum switching speed, cross-over distortion effects are automatically eliminated.

Figure 6:
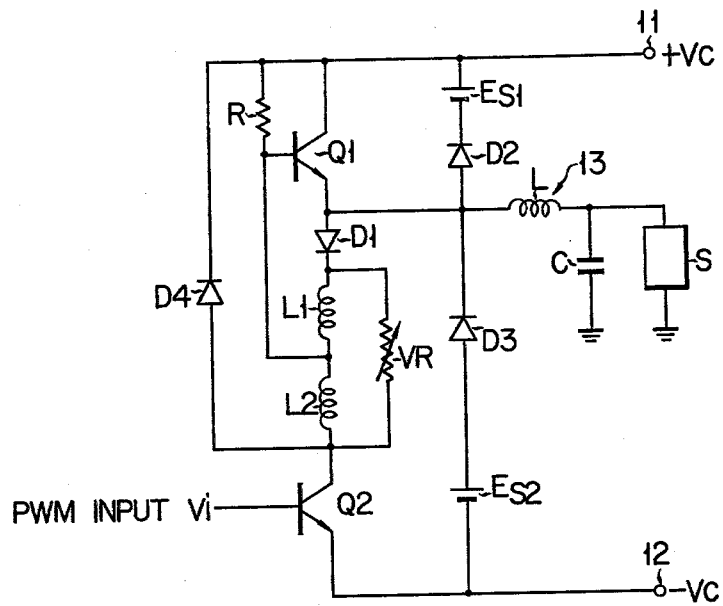
FIG. 6 is a modification of the circuit of FIG. 4.

To achieve the same effect as described above, the circuit of FIG. 4 may be modified to a circuit as shown in FIG. 6 in which a first sub-DC power source Es1 is connected in series with the diode D2 between the positive power supply terminal 11 and the junction of transistor Q1 and diode D1, and a second sub-DC power source Es2 is connected in series with the diode D3 between the negative power supply terminal 12 and the junction of transistor Q1 and diode D1. The first sub-DC power source Es1 is set to have a magnitude of the supply voltage which is not less than the sum of collector-emitter saturation voltage of transistor Q1 and the forward voltage drop of diode D2. The second sub-DC power source Es2 is set to have a magnitude of the supply voltage which is not less than the sum of forward voltage drop of diode D1, voltage drop across the inductive network L1, L2, collector-emitter saturation voltage of transistor Q2 and forward voltage drop across diode D3. The sub-DC power sources may be of a variable type.

In the embodiments of the invention described above, under quiescent conditions there is a high circulating current of the order of amps. However, the component values are chosen, and collector and/or emitter resistors (not shown) are provided, to control the level of circulating currents I01, I02, I03 in the presence of an analogue input signal so that at maximum peak current the offset voltage tends to be cancelled in a manner akin to a sliding bias. The operation of the amplifier thus changes from Class A-D to Class B-D, ensuring that the amplifier operating point stays as far as possible on the minimum rise and fall time curve of the active power output devices. Such a mechanism allows the amplifier to (a) achieve very high speed operation, and (b) maintain these fast rise and fall times substantially constant over the whole of the dynamic operating range of the system. Very low distortion can thus be achieved and maintained over a wide range of output powers.

Usually in an audio output amplifier circuit, a Darlington-connected transistor circuit is used to obtain a large output current. The Darlington-connected transistors may be used also in the abovementioned pulse width modulated signal amplifier for the purpose of obtaining a large output current. Since the transistors used in the pulse width modulated signal amplifier operates in switching mode, transistors with a high switching speed, i.e., a short carrier storage time must be used. In an amplifier for providing a high output power, transistors which can withstand a high DC power supply voltage are necessary. Transistors having a high switching speed and a high voltage withstanding property are expensive and therefore, the necessity of using a plurality of expensive transistors to construct a Darlington circuit is not desirable.

Figure 7:
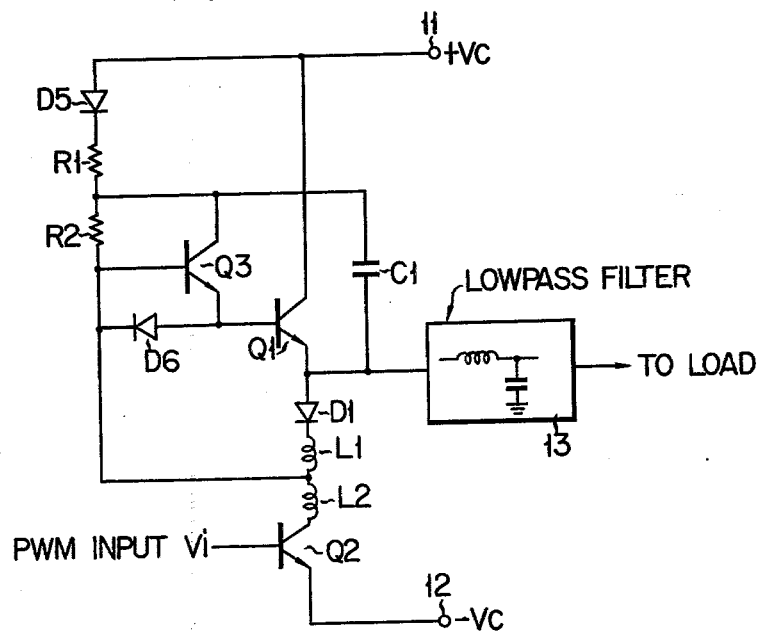
FIG. 7 is another modification of the circuit of FIG. 4.

In a circuit of FIG. 7, the base of NPN type transistor Q3 in an emitter follower configuration with the transistor Q1 and drives the transistor Q1 and is connected to the junction of the coils L1 and L2. The positive power supply terminal 11 is connected to the base of transistor Q3 through a diode D5, and resistors R1 and R2. The transistor Q3 has its collector connected to the junction of resistors R1 and R2 and its emitter connected to the base of transistor Q1. The base of transistor Q1 is connected to the anode of a diode D6 the cathode of which is connected to the base of transistor Q3. A capacitor C1 is connected between the collector of transistor Q3 and the junction of transistor Q1 and diode D1. In the circuit of FIG. 7, the reverse current by-passing diodes D2, D3 and D4 are not shown for simplicity of the drawing.

In the circuit of FIG. 7 the capacitor C1 is charged through a charging path formed by diode D5, resistor R1, capacitor C1, diode D1, inductive network L1, L2 and transistor Q2 during the period that the transistor Q2 is ON. When the transistor Q2 is rendered nonconducting by an input signal applied thereto, the doide D1 is made nonconducting and the transistor Q3 is rendered conducting because a base current is supplied thereto by the capacitor C1 through the resistor R2. This results in conduction of transistor Q1. Due to the conduction of transistor Q1 a terminal voltage of capacitor C1 rises above the positive power supply voltage +Vc with a result that the diode D5 is reverse biased. Under this condition the base currents of transistors Q3, Q1, and the collector current of transistor Q3 are supplied only by the capacitor C1. The capacitor C1 discharges when both the transistors Q1 and Q2 are ON.

When the transistor Q2 is made ON by the input signal the transistors Q1 and Q3 are rendered nonconducting due to the forward voltage drop across the diode D1. The diode D6 is adapted to cause, at the instant of conduction of transistor Q2, minority carriers which have been stored in the base region of transistor Q1 to run off into the negative power supply terminal 12, to thereby make the transistor Q1 OFF quickly.

With the pulse width modulated signal amplifier, since a carrier signal frequency is much higher than a modulating audio signal frequency, for example, about 430 KHz, the capacitor C1 is repeatedly charged and discharged at a high speed. However, since the charging and discharging time constants for the capacitor C1 is set longer than the period of lowest frequency audio signal, the charged voltage across the capacitor C1 does not almost change. For example, in a case where both the resistors R1 and R2 have a value of 560 ohms, the capacitor C1 has a value of 1,000 microfarads, and the positive and negative power supply voltages +Vc, −Vc are +42 volts and −42 volts, respectively, the charged voltage across the capacitor C1 is about 20 volts at most. This means that, as the transistor Q3 constituting a Darlington circuit together with transistor Q1 and driving the same, a transistor can be used which has a withstanding voltage of 20 volts at most far lower than that of transistors Q1 and Q2.

Though bipolar transistors are used as active devices in the pulse width modulated signal amplifier so far described unipolar transistors or field effect transistors may be used instead.

What is claimed is:

1. A pulse width modulated signal amplifier comprising:
    a DC power source having first and second terminals;
    first and second transistor means each having a control electrode and a conduction path;
    an inductance;
    a diode connected in series with said first and second transistor means conduction paths and said inductance between said first and second terminals of said DC power source and in the forward direction with respect to the polarity of said DC power source
    such that said diode is connected between said first and second transistor means and said inductance is connected between said diode and said second transistor means;
    a lowpass filter having a choke coil and connected between a load and a junction of said first transistor means and said diode;
    first connection means connecting a point of said inductance to said control electrode of said first transistor means;
    second connection means connecting said control electrode of said first transistor means to said first terminal means of said DC power source; and
    means for applying a pulse width modulated signal to be amplified to said control electrode of said second transistor means.

2. A pulse width modulated signal amplifier according to claim 1 further comprising a second further inductance connected between said frist-mentioned inductance and said second transistor means and a second diode for connecting a junction of said second inductance and said second transistor means to said first terminal of said DC power source, the polarity of said second diode being such that it conducts when a potential at the junction of said second inductance and said second transistor means is higher than that at said first terminal of said DC power source.

3. A pulse width modulated signal amplifier according to claim 2 further comprising a resistor connected in parallel with said first and second inductance.

4. A pulse width modulated signal amplifier according to claim 3 wherein said resistor is of a variable type.

5. A pulse width modulated signal amplifier according to claim 1 wherein said junction of said first-mentioned diode and said first transistor means is connected to a first intermediate tap of said choke coil of said lowpass filter, and further comprising a second diode connected between said first terminal of said DC power source and a second intermediate tap of said choke coil, and a third diode connected between said second terminal of said DC power source and one end of said choke coil closer to said second intermediate tap than another end of said choke coil to be connected to said load, said second and third diodes each being connected in the backward direction with respect to the polarity of said DC power source.

6. A pulse width modulated signal amplifier according to claim 1 further comprising a first sub-DC power source and a second diode connected in series between said first terminal of said DC power source and said junction of said first transistor means and said first-mentioned diode, and a second sub-DC power source and a third diode connected in series between said second terminal of said DC power source and said junction of said first transistor means and said first diode, said second and third diodes each being connected in the backward direction with respect to the polarity of said DC power source, said first sub-DC power source having a magnitude of supply voltage and being arranged with the polarity allowing a current to flow through a closed loop formed by said first transistor means and said second diode when said first transistor means is rendered conducting, and said second sub-DC power source having a mangnitude of supply voltage and being arranged with the polarity allowing a current to flow through a closed loop formed by said second transistor means, first and third diodes and said inductance when said second transistor means is rendered conducting.

7. A pulse width modulated signal amplifier according to claim 1 wherein said first transistor means is comprised of first and second bipolar transistors each having a base and a collector-emitter path, the collector-emitter path of said first bipolar transistor being connected between said first terminal of said DC power source and said diode, the base of said second bipolar transistor being connected to a point between said inductance and said second transistor means by means of said first connection means and to said first terminal of said DC power source by means of said second connection means having series-connected first and second resistors, and the collector-emitter path of said second bipolar transistor being connected between the base of said first bipolar transistor and a junction of said first and second resistors, and a capacitor is connected between the junction of said first and second resistors and the junction of said first bipolar transistor and said diode.

* * * * *